(12) United States Patent
Wang et al.

(10) Patent No.: US 8,071,409 B2
(45) Date of Patent: Dec. 6, 2011

(54) FABRICATION METHOD OF LIGHT EMITTING DIODE

(75) Inventors: Te-Chung Wang, Taichung County (TW); Chun-Jong Chang, Hsinchu County (TW); Kun-Fu Huang, Miaoli County (TW)

(73) Assignee: Lextar Electronics Corp., Hsinchu (TW)

( * ) Notice: Subject to any disclaimer, the term of this patent is extended or adjusted under 35 U.S.C. 154(b) by 0 days.

(21) Appl. No.: 12/542,703

(22) Filed: Aug. 18, 2009

(65) Prior Publication Data
US 2010/0285626 A1    Nov. 11, 2010

(30) Foreign Application Priority Data
May 7, 2009 (TW) ................. 98115169 A

(51) Int. Cl.
*H01L 21/00* (2006.01)
*H01L 33/00* (2006.01)

(52) U.S. Cl. .... 438/47; 438/962; 977/755; 257/E33.032

(58) Field of Classification Search ............ 438/47, 438/962; 977/755; 257/E33.032
See application file for complete search history.

(56) References Cited

U.S. PATENT DOCUMENTS

| | | | |
|---|---|---|---|
| 7,091,514 B2 | 8/2006 | Craven et al. | |
| 7,186,302 B2 | 3/2007 | Chakraborty et al. | |
| 2005/0214992 A1* | 9/2005 | Chakraborty et al. | 438/172 |
| 2007/0012932 A1* | 1/2007 | Kobayakawa et al. | 257/94 |
| 2007/0026551 A1* | 2/2007 | Sato et al. | 438/22 |

* cited by examiner

*Primary Examiner* — Charles Garber
*Assistant Examiner* — Calvin Choi
(74) *Attorney, Agent, or Firm* — Liu & Liu

(57) ABSTRACT

A fabrication method of light emitting diode is provided. A first type doped semiconductor layer is formed on a substrate. Subsequently, a light emitting layer is formed on the first type doped semiconductor layer. A process for forming the light emitting layer includes alternately forming a plurality of barrier layers and a plurality of quantum well layers on the first type doped semiconductor layer. The quantum well layers are formed at a growth temperature T1, and the barrier layers are formed at a growth temperature T2, where T1<T2. Then, a second type doped semiconductor layer is formed on the light emitting layer.

23 Claims, 9 Drawing Sheets

FABRICATION METHOD OF LIGHT EMITTING DIODE

CROSS-REFERENCE TO RELATED APPLICATION

This application claims the priority benefit of Taiwan application serial no. 98115169, filed on May 7, 2009. The entirety of the above-mentioned patent application is hereby incorporated by reference herein and made a part of specification.

BACKGROUND OF THE INVENTION

1. Field of the Invention

The present invention generally relates to a method of fabricating a light emitting diode (LED); more specifically, to a method of fabricating a light emitting diode by cyclic ramping of a process temperature.

2. Description of Related Art

In recent years, due to improvements in the luminescence efficiency of the light emitting diodes (LEDs), LEDs have begun to gradually replace the fluorescent lamps and the incandescent bulbs in some applications, such as light source of the scanner where rapid response is paramount, the backlight source for the liquid crystal display (LCD), and the light source for general illumination devices. Since the III-V nitrides are semiconductor materials with wide band gap, the light emitted therefrom encompasses almost the entire visible and ultraviolet spectrum. Consequently, III-V materials such as gallium nitride (GaN) have been widely used in LEDs.

FIG. 1 is a cross-sectional view illustrating a conventional LED. FIG. 2 is a process temperature curve diagram for the LED depicted in FIG. 1. FIG. 3 is an X-ray diffraction spectrum diagram for a light emitting layer of the LED depicted in FIG. 1. Referring to FIG. 1, the conventional LED 100 includes an n-type GaN layer 110, a p-type GaN layer 120, a light emitting layer 130 disposed between the n-type GaN layer 110 and the p-type GaN layer 120, and a substrate 140. The n-type GaN layer 110, the light emitting layer 130, and the p-type GaN layer 120 are stacked on a surface 142 of the substrate 140.

The light emitting layer 130 is fabricated by alternately forming a plurality of GaN layers 132 and a plurality of indium gallium nitride (InGaN) layers 134, where the GaN layers 132 are barrier layers and the InGaN layers 134 are quantum well layers. Furthermore, only a portion of the n-type GaN layer 110 is covered by the p-type GaN layer 120 and the light emitting layer 130. Two electrodes E are respectively disposed on and electrically connected to the p-type GaN layer 120 and the n-type GaN layer 110.

Conventionally, metal organic chemical vapor deposition (MOCVD) is used to form the n-type GaN layer 110, the p-type GaN layer 120, and the light emitting layer 130 of the LED 100. More specifically, referring to FIG. 1 and FIG. 2, first a process temperature is maintained at a first growth temperature $T_H$, and the n-type GaN layer 110 is formed on the surface 142 of the substrate 140 at the first growth temperature $T_H$. Next, the process temperature is ramped down to a second growth temperature $T_L$, where $T_H > T_L$, and the light emitting layer 130 is formed on the n-type GaN layer 110 at the second growth temperature $T_L$. Finally, the process temperature is ramped up to a third growth temperature, and the p-type GaN layer 120 is formed at the third growth temperature.

It should be noted that, if the process temperature is substantially high during a growing process of the InGaN layers 134 within the light emitting layer 130, the substantially high growth temperature may cause precipitation of indium. Therefore, to avoid precipitation of indium, the light emitting layer 130 is formed at a second growth temperature lower than the first growth temperature $T_H$. However, as shown in FIG. 3, the X-ray diffraction spectrum peak of the GaN layers 132 formed at the second growth temperature $T_L$ has a wide full width at half maximum (FWHM). In other words, the GaN layers 132 formed at the second growth temperature $T_L$ has poor epitaxy quality. Moreover, optical characteristics of the LED 100 are affected by such epitaxy quality.

SUMMARY OF THE INVENTION

The present invention provides a method of fabricating an LED, wherein a growth temperature of a plurality of quantum well layers of a light emitting layer is lower than a growth temperature of a plurality of barrier layers of the light emitting layer.

The present invention provides the method of fabricating the LED. A first type doped semiconductor layer is formed on a substrate. Next, a light emitting layer is formed on the first type doped semiconductor layer by alternately forming a plurality of barrier layers and a plurality of quantum well layers. The quantum well layers are formed at a growth temperature T1, the barrier layers are formed at a growth temperature T2, and the growth temperature T1 is lower than the growth temperature T2. Finally, a second type doped semiconductor layer is formed on the light emitting layer.

In one embodiment of the present invention, a material of the first type doped semiconductor layer includes n-type doped GaN, and a material of the second type doped semiconductor layer includes p-type doped GaN.

In one embodiment of the present invention, a material of the barrier layers includes GaN, and a material of the quantum well layers includes InGaN.

In one embodiment of the present invention, the growth temperature T1 is between 700° C. to 900° C., and the growth temperature T2 is between 800° C. and 1100° C.

In one embodiment of the present invention, T2−T1≧30° C.

In one embodiment of the present invention, a process of forming the barrier layers and the quantum well layers is described beneath. First, a barrier layer is formed at the growth temperature T2. Next, the process temperature is ramped down from the growth temperature T2 to the growth temperature T1. Afterwards, a quantum well layer is formed at the growth temperature T1. Next, the process temperature is ramped up from the growth temperature T1 to the growth temperature T2. The aforementioned steps are repeated at least once.

In one embodiment of the present invention, during a process of ramping up the process temperature from the growth temperature T1 to the growth temperature T2, a ramp up rate is greater or equal to 1° C. per second.

In one embodiment of the present invention, during the process of ramping up the process temperature from the growth temperature T1 to the growth temperature T2, the ramp up rate is greater or equal to 2° C. per second.

In one embodiment of the present invention, the growth temperature T2 is lower than a growth temperature of the first type doped semiconductor layer.

In one embodiment of the present invention, the growth temperature T2 is lower than a growth temperature of the second type doped semiconductor layer.

In one embodiment of the present invention, the method of fabricating the LED further includes forming a first electrode and a second electrode, wherein the first electrode is electrically connected to the first type doped semiconductor layer, and the second electrode is electrically connected to the second type doped semiconductor layer.

In light of the foregoing descriptions, in order to improve the epitaxy quality of the barrier layers, and hence the optical characteristics of the LED, cyclic ramping of a process temperature is used to form a plurality of barrier layers at a substantially high growth temperature and a plurality of quantum well layers at a substantially low growth temperature.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIG. 4A to FIG. 4D are cross-sectional views illustrating an LED during fabrication according to one embodiment of the present invention. FIG. 5 is a process temperature curve diagram for the LED depicted in FIG. 4A to FIG. 4D. In the exemplary embodiments described below, a first type doped semiconductor layer, a light emitting layer, and a second type doped semiconductor layer are formed by MOCVD, for example.

Figure 1:
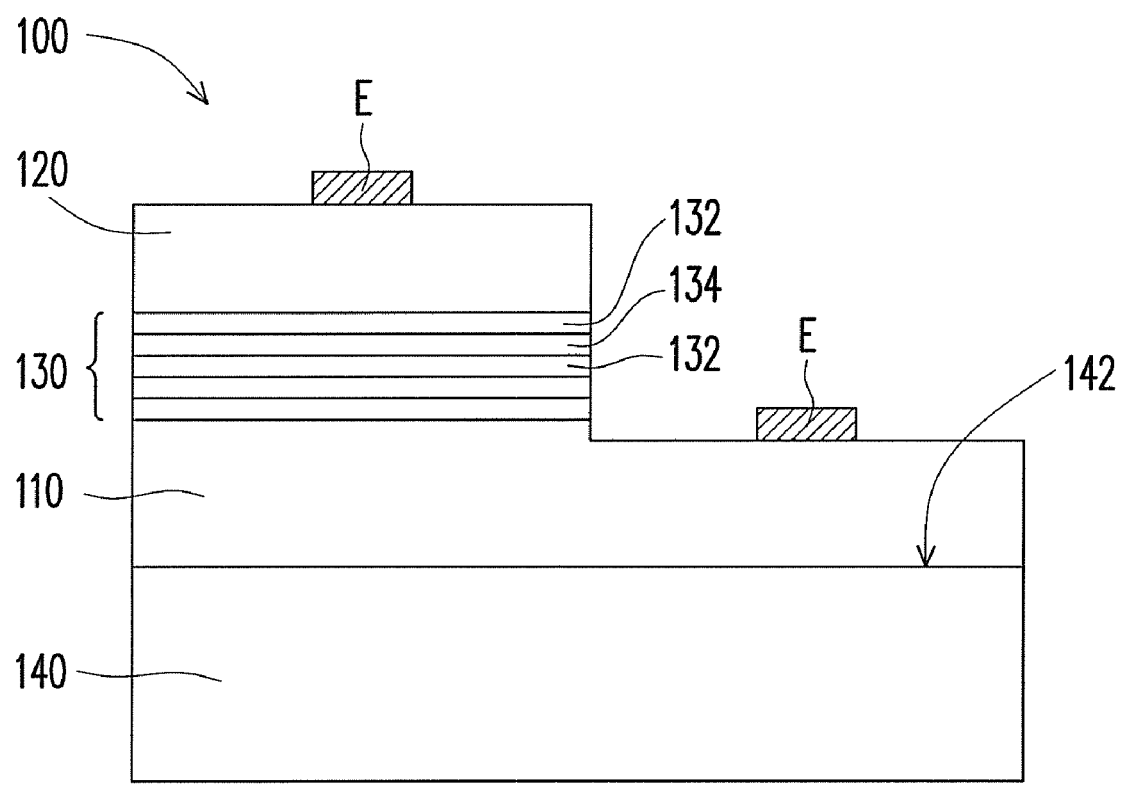
FIG. 1 is a cross-sectional view illustrating a conventional LED.
Figure 2:
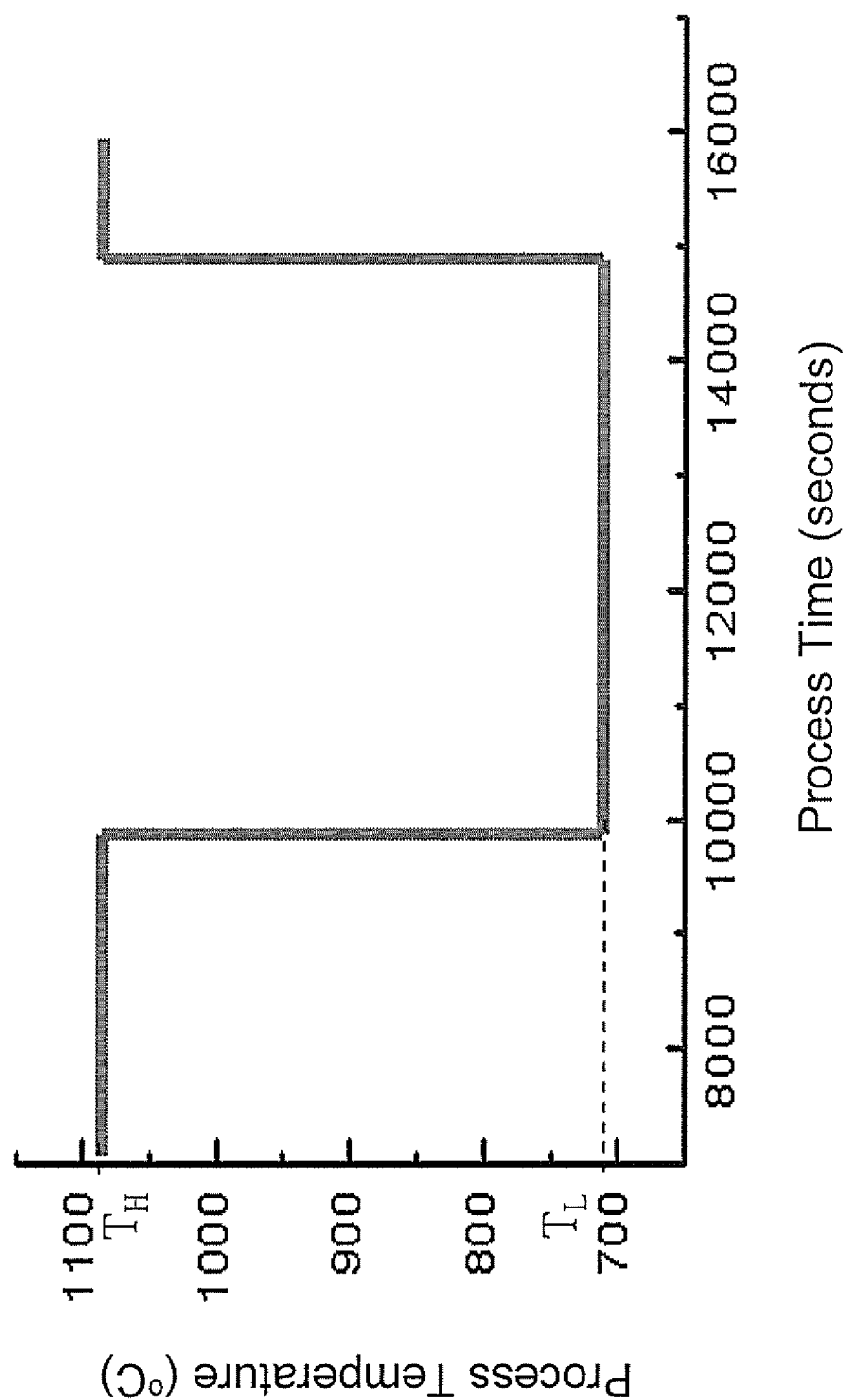
FIG. 2 is a process temperature curve diagram for the LED depicted in FIG. 1.
Figure 3:
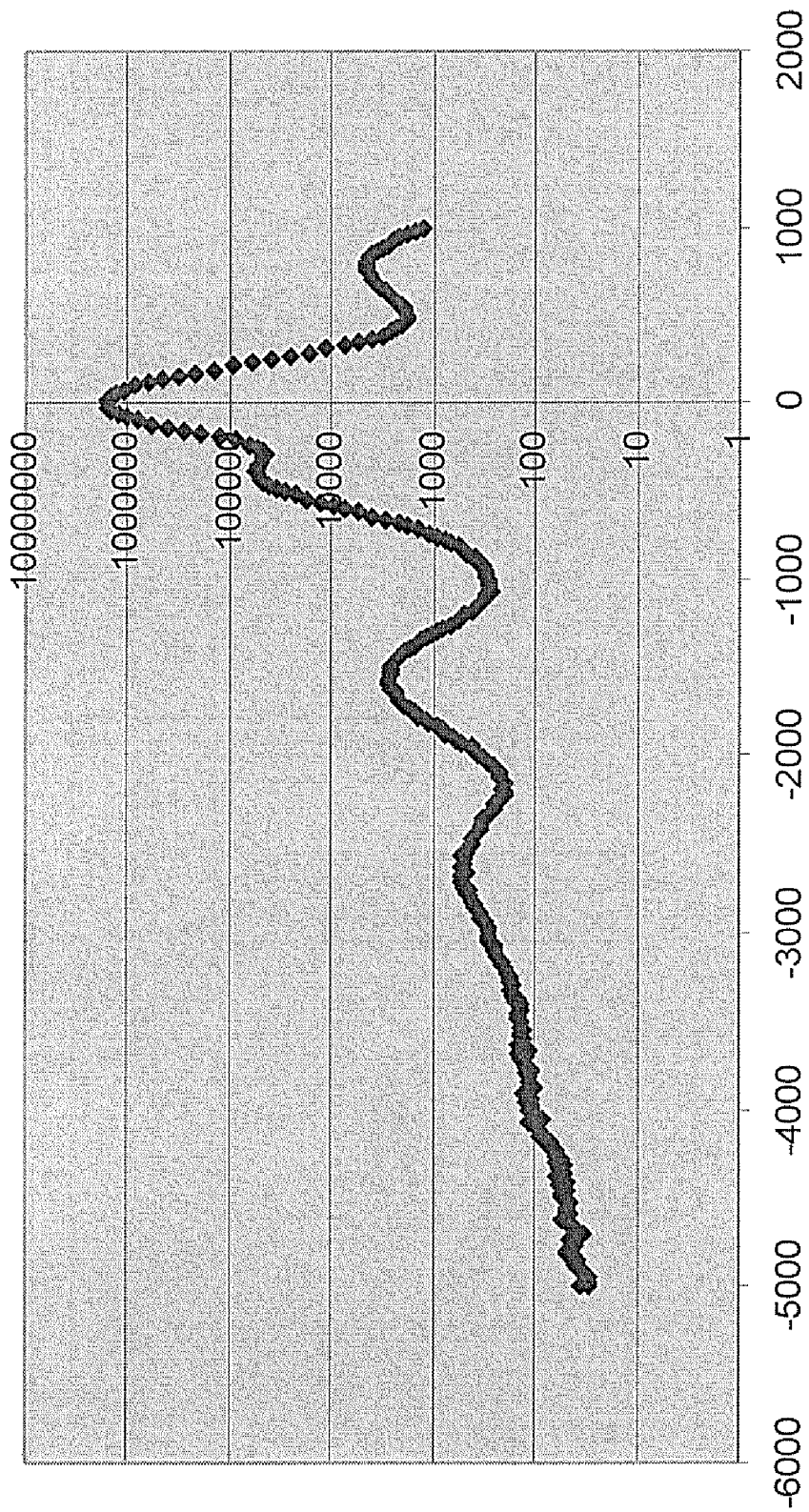
FIG. 3 is an X-ray diffraction spectrum diagram for a light emitting layer of the LED depicted in FIG. 1.
Figure 4A:
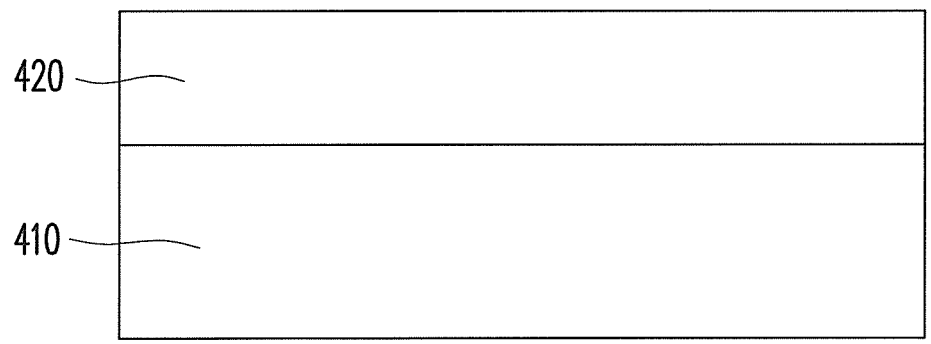
FIG. 4A to FIG. 4D are cross-sectional views illustrating an LED during fabrication according to one embodiment of the present invention.
Figure 5:
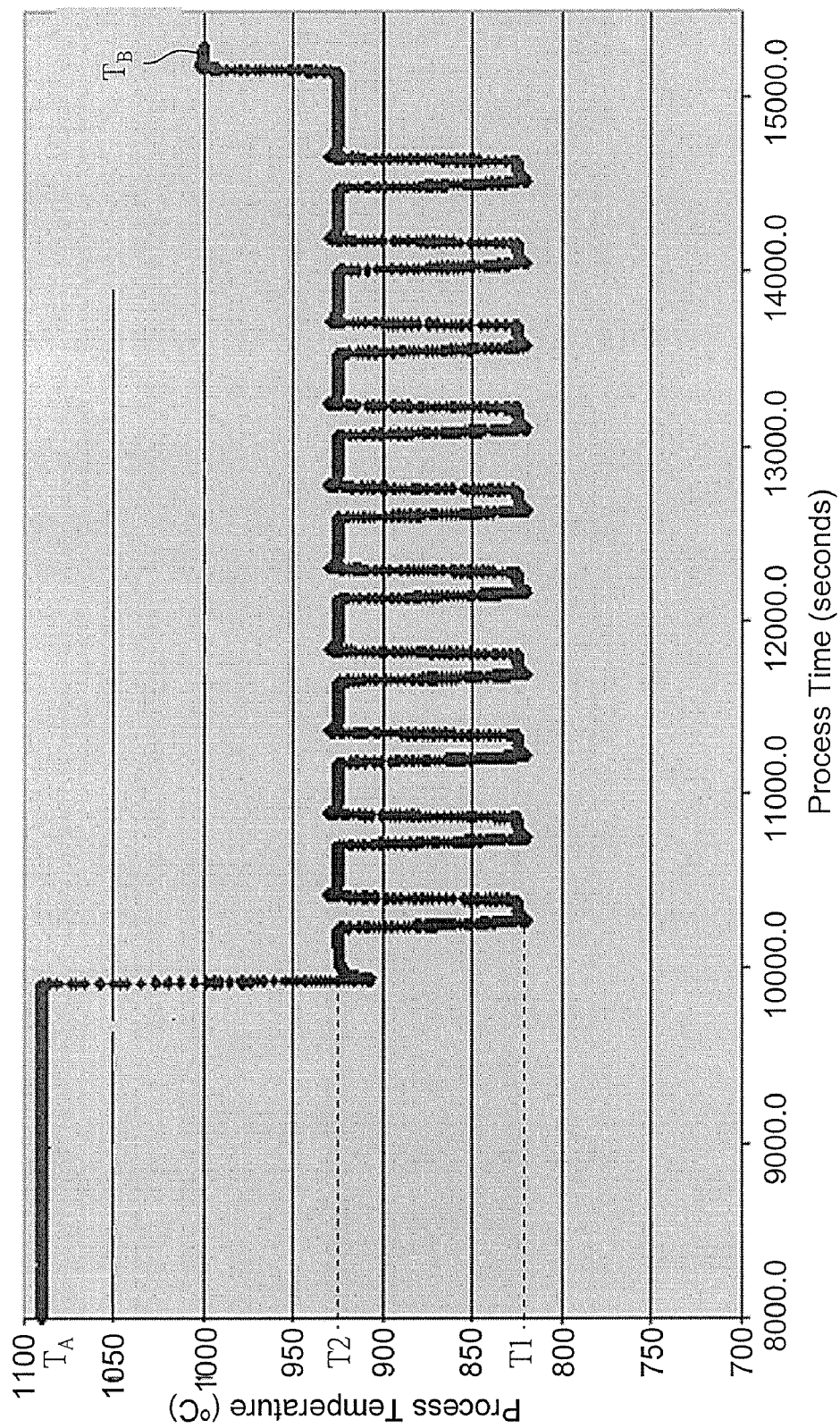
FIG. 5 is a process temperature curve diagram for the LED depicted in FIG. 4A to FIG. 4D.

Referring to both FIG. 4A and FIG. 5, a process temperature is maintained at a growth temperature $T_A$. At a process temperature that reaches the growth temperature $T_A$, a first type doped semiconductor layer 420 is formed on a substrate 410. A material for the first type doped semiconductor layer 420 includes n-type doped GaN such as Si-doped GaN, for instance. In the present embodiment of the invention, the substrate 410 is a sapphire substrate, for example.

Figure 4B:
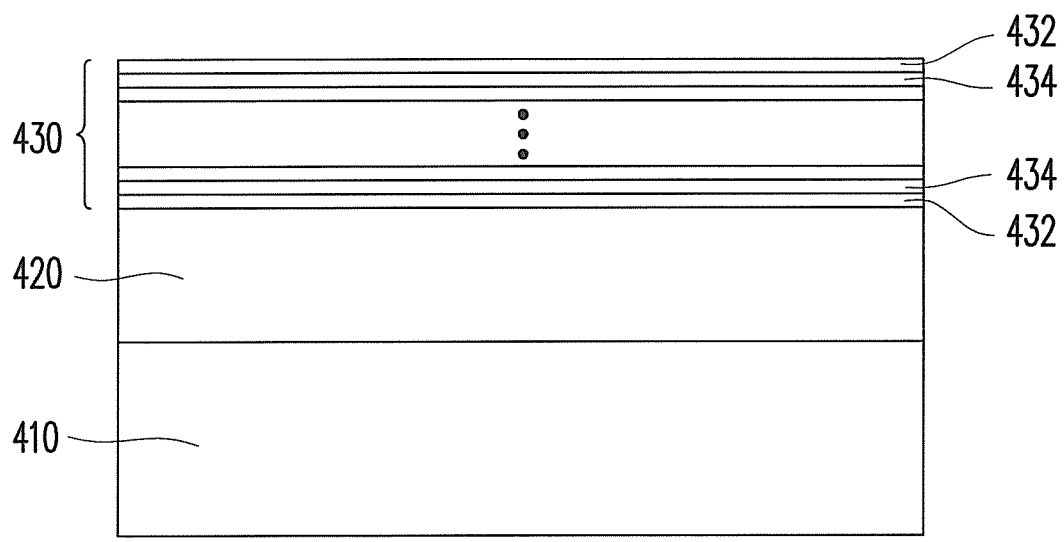

Referring next to FIG. 4B and FIG. 5, a light emitting layer 430 is formed on the first type doped semiconductor layer 420. In the present embodiment of the invention, the light emitting layer 430 is formed on the first type doped semiconductor layer 420 by alternately forming a plurality of barrier layers 432 and a plurality of quantum well layers 434. The quantum well layers 434 are formed at a growth temperature T1, the barrier layers 432 are formed at a growth temperature T2, and the growth temperature T1 is lower than the growth temperature T2. In addition, in the present embodiment of the invention, the growth temperature T2 is lower than the growth temperature $T_A$ of the first type doped semiconductor layer. Therefore, the process temperature is required to be ramped down from the growth temperature $T_A$ to the growth temperature T2 before the barrier layers 432 are formed.

Specifically, the process of alternately forming the barrier layers 432 and the quantum well layers 434 is described below. First, a barrier layer is formed at a process temperature that reaches the growth temperature T2. Next, the process temperature is ramped down from the growth temperature T2 to the growth temperature T1. In the present embodiment of the invention, during a ramp down process of the process temperature from the growth temperature T2 to the growth temperature T1, a ramp down rate is substantially higher than or equal to 1° C. per second, or the ramp down rate is substantially higher than or equal to 2° C. per second.

Subsequently, a quantum well layer 434 is formed at a process temperature that reaches the growth temperature T1. Next, the process temperature is ramped up from the growth temperature T1 to the growth temperature T2. In the present embodiment of the invention, during a ramp up process of the process temperature from the growth temperature T1 to the growth temperature T2, a ramp up rate is substantially higher or equal to 1° C. per second, or the ramp up rate is substantially higher or equal to 2° C. per second.

Afterwards, the aforementioned steps are repeated a plurality of times, and thus a plurality of barrier layers 432 and a plurality of quantum well layers 434 are formed by cyclic ramping of the process temperature. Accordingly, a plurality of barrier layers 432/quantum well layers 434 pairs are formed.

In the present embodiment of the invention, a material of the barrier layers 432 includes GaN, and a material of the quantum well layers 434 includes InGaN. In the present embodiment of the invention, the growth temperature T1 is for instance between 700° C. to 900° C., the growth temperature T2 is for instance between 800° C. to 1100° C., and T2−T1≧30° C.

Figure 4C:
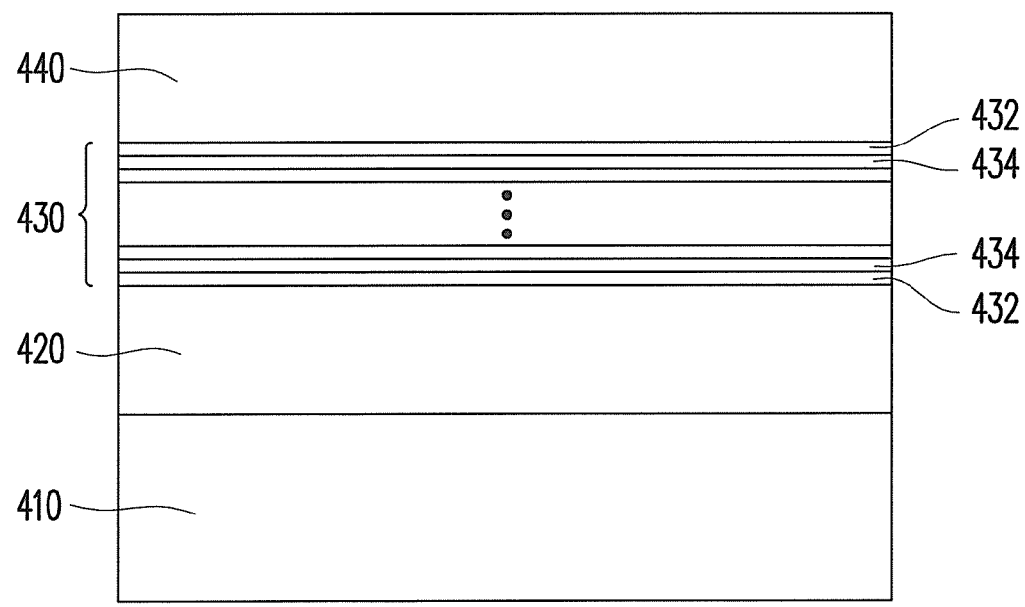

Referring next to FIG. 4C and FIG. 5, in the present embodiment of the invention, the process temperature is changed from the growth temperature T2 to a growth temperature $T_B$. At the growth temperature $T_B$, a second type doped semiconductor layer 440 is formed on the light emitting layer 430. A material for the second type doped semiconductor layer 440 includes p-type doped GaN such as magnesium (Mg) doped GaN.

Figure 4D:
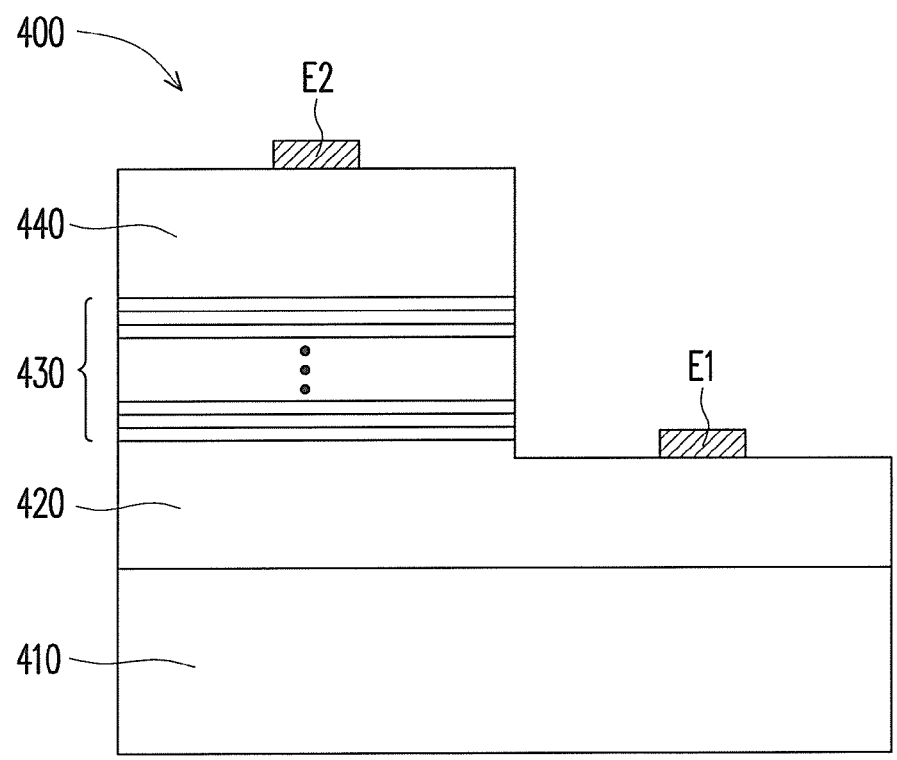

Referring next to FIG. 4D, in the present embodiment of the invention, a portion of the second type doped semiconductor layer 440 and a portion of the light emitting layer 430 is removed, and accordingly a portion of the first type doped semiconductor layer 420 is exposed. Afterwards, a first electrode E1 is formed on the first type doped semiconductor layer 420, and a second electrode E2 is formed on the second type doped semiconductor layer 440. The first electrode E1 is electrically connected to the first type doped semiconductor layer 420, and the second electrode E2 is electrically connected to the second type doped semiconductor layer 440.

In the present embodiment of the invention, the LED 400 is a planar LED. In other embodiments of the present invention, a vertically oriented LED (not shown) can be fabricated by a process of transferring the first type doped semiconductor layer 420, the light emitting layer 430, and the second type doped semiconductor layer 440 through the substrate 410 onto other conductive substrates (not shown).

Figure 6:
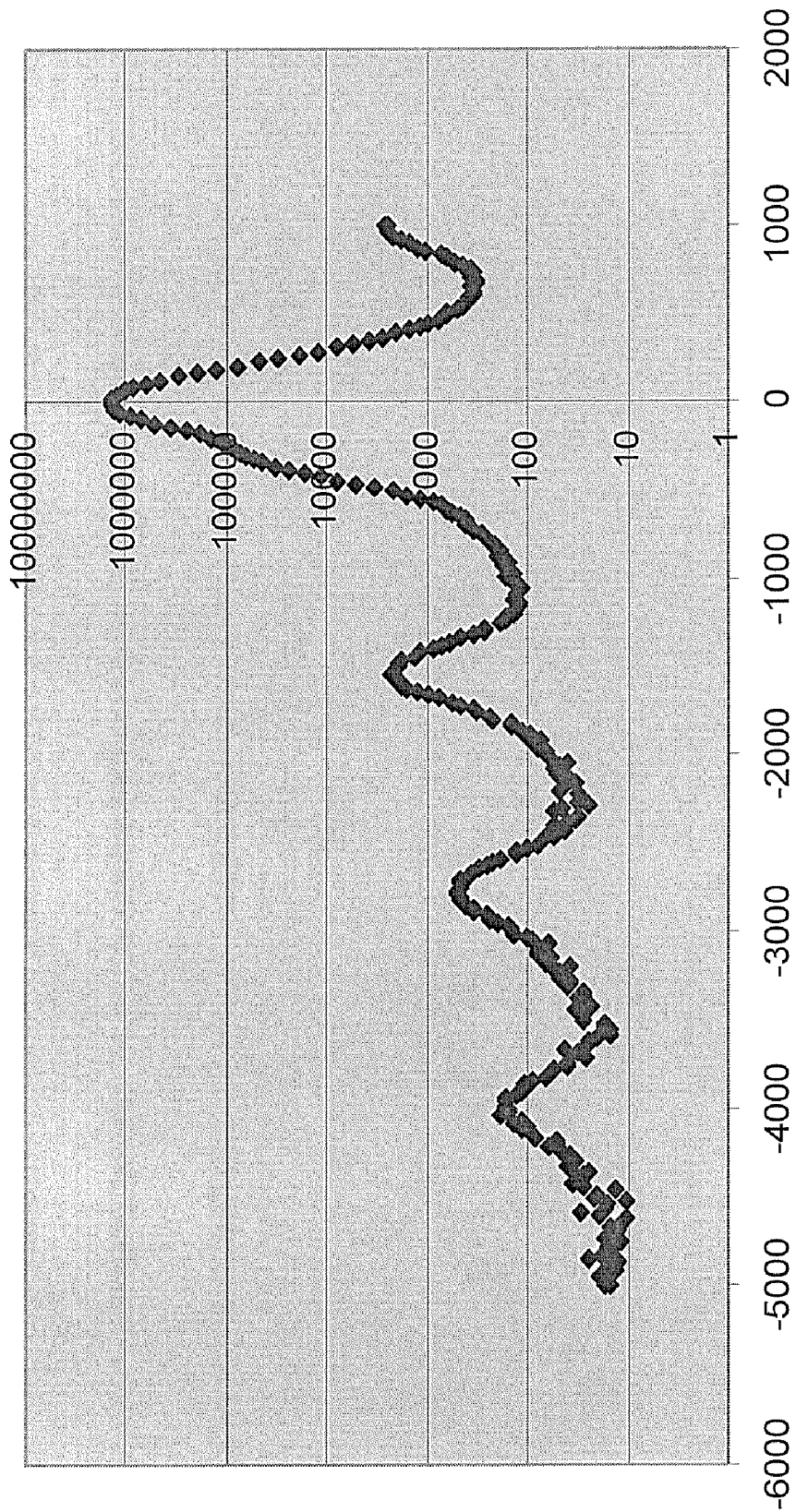
FIG. 6 is an X-ray diffraction spectrum diagram for a light emitting layer according to one embodiment of the present invention.
Figure 7:
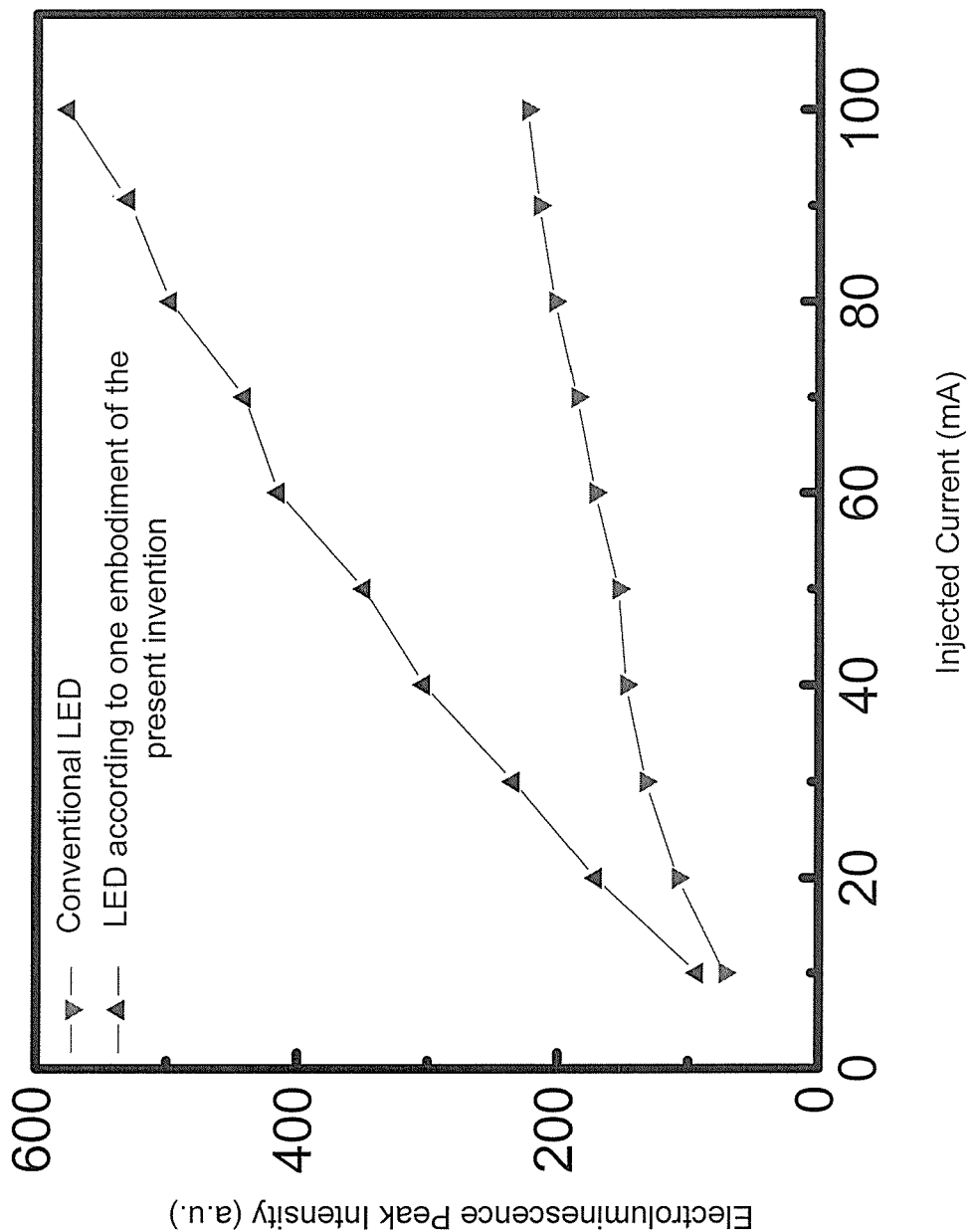
FIG. 7 is a curve diagram illustrating the relationship between the electroluminescence peak intensity and the injected current for a conventional LED according to one embodiment of the present invention.

FIG. 6 is an X-ray diffraction spectrum diagram for a light emitting layer according to one embodiment of the present invention. FIG. 7 is a curve diagram illustrating the relationship between the electroluminescence peak intensity and the injected current for a conventional LED according to one embodiment of the present invention.

As shown in FIG. 6, in the present embodiment of the invention, the FWHM of the X-ray diffraction spectrum peak is substantially narrow. In other words, the epitaxy quality of the barrier layers 432 is improved. In addition, as shown in FIG. 7, when an equal amount of injected current is provided, the electroluminescence peak intensity of the LED 400 as presently embodied is substantially higher than the electroluminescence peak intensity of the conventional LED.

As shown in the foregoing descriptions, since the quantum well layers 434 are formed at a substantially low process temperature and the barrier layers 432 are formed at a substantially high process temperature, the epitaxy quality of the barrier layers 432 as presently embodied is improved. Therefore, the LED in the present embodiment of the invention possesses better optical characteristics.

Figure 8:
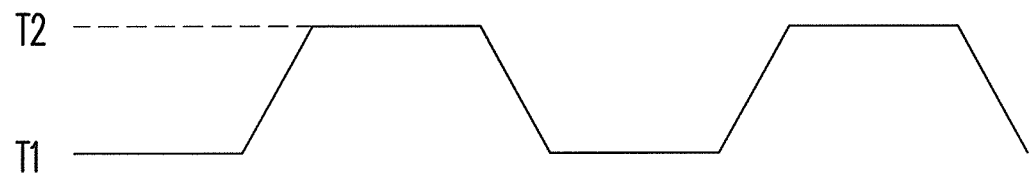
FIG. 8 is an idealized process temperature curve diagram according to one embodiment of the present invention.
Figure 9:
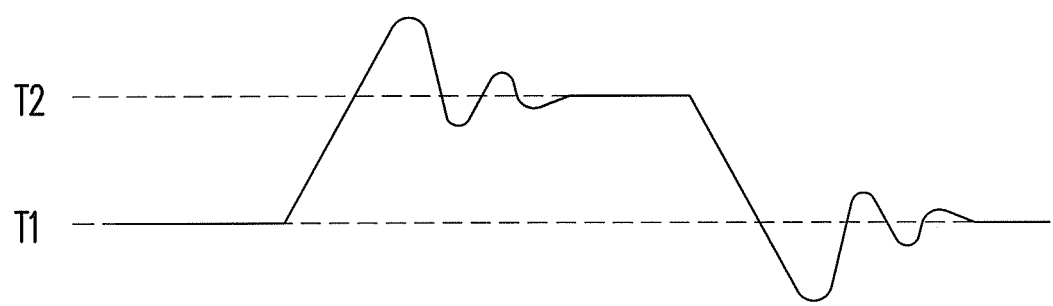
FIG. 9 is an experimental process temperature curve diagram according to one embodiment of the present invention.

FIG. 8 is an idealized process temperature curve diagram according to one embodiment of the present invention. FIG. 9 is an experimental process temperature curve diagram according to another embodiment of the present invention. Referring to FIG. 8, under an idealized situation, the process temperature is ramped up from the growth temperature T1 to the growth temperature T2 at a constant ramp up rate, then the process temperature is maintained for a period of time at the growth temperature T2, then the process temperature is ramped down from the growth temperature T2 to the growth temperature T1 at a constant ramp down rate, and finally the process temperature is maintained at the growth temperature T1 for a period of time. Referring now to FIG. 9, in an experimental situation, the process temperature is ramped up at a constant ramp up rate from the growth temperature T1 to a temperature larger than the growth temperature T2. Then, the process temperature gradually reaches the growth temperature T2, and the process temperature is maintained at T2 for a period time. Afterwards, the process temperature is ramped down from the growth temperature T2 to a temperature lower than the growth temperature T1. The process temperature gradually reaches the growth temperature T1, and the process temperature is maintained at T1 for a period of time.

Although the experimental situation deviates from the ideal, ramping up the process temperature to a temperature above the growth temperature T2 does not significantly affect the epitaxy quality of the barrier layers 432 as presently embodied. Moreover, ramping down the process temperature to a temperature below the growth temperature T1 does not result in precipitation of indium. Therefore, experimental process temperature conditions do not significantly affect the optical characteristics of the LED as presently embodied in the invention.

In summary, in order to improve the epitaxy quality of the barrier layers, and the optical characteristics of the LED, cyclic ramping of a process temperature is used to form a plurality of barrier layers at a substantially high growth temperature and a plurality of quantum well layers at a substantially low growth temperature.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of fabricating a light emitting diode, comprising:
    forming a first type doped semiconductor layer on a substrate;
    forming a light emitting layer on the first type doped semiconductor layer by alternately forming a plurality of barrier layers and a plurality of quantum well layers in a plurality of temperature cycles between a substantially low growth temperature T1 and a substantially high growth temperature T2, wherein the quantum well layers are formed at the growth temperature T1, all the barrier layers are formed at the growth temperature T2 in the temperature cycles, the growth temperature T1 is lower than the growth temperature T2, thereby improving epitaxy quality of the barrier layers and decreasing precipitation in the quantum well layers; and
    forming a second type doped semiconductor layer on the light emitting layer.

2. The method of fabricating the light emitting diode as claimed in claim 1, wherein the first type doped semiconductor layer comprises n-type doped gallium nitride, and the second type doped semiconductor layer comprises p-type doped gallium nitride.

3. The method of fabricating the light emitting diode as claimed in claim 1, wherein the barrier layers comprise gallium nitride, and the quantum well layers comprise indium gallium nitride, wherein precipitation of indium in the quantum well layers is decreased at the substantially low growth temperature T1 in the temperature cycles.

4. The method of fabricating the light emitting diode as claimed in claim 1, wherein the growth temperature T1 is between 700° C. to 900° C., and the growth temperature T2 is between 800° C. to 1100° C.

5. The method of fabricating the light emitting diode as claimed in claim 1, wherein T2−T1≧30° C.

6. The method of fabricating the light emitting diode as claimed in claim 1, wherein a process of alternately forming the barrier layers and the quantum well layers comprises:
    forming a barrier layer at the growth temperature T2;
    ramping down process temperature from the growth temperature T2 to the growth temperature T1;
    forming a quantum well layer at the growth temperature T1;
    ramping up process temperature from the growth temperature T1 to the growth temperature T2; and
    repeating the aforementioned steps at least once.

7. The method of fabricating the light emitting diode as claimed in claim 1, wherein a ramp up rate is higher than or equal to 1° C. per second when ramping up the process temperature from the growth temperature T1 to the growth temperature T2.

8. The method of fabricating the light emitting diode as claimed in claim 1, wherein a ramp up rate is higher than or equal to 2° C. per second when ramping up the process temperature from the growth temperature T1 to the growth temperature T2.

9. The method of fabricating the light emitting diode as claimed in claim 1, wherein the growth temperature T2 is lower than a growth temperature of the first type doped semiconductor layer.

10. The method of fabricating the light emitting diode as claimed in claim 1, wherein the growth temperature T2 is lower than a growth temperature of the second type doped semiconductor layer.

11. The method of fabricating the light emitting diode as claimed in claim 1, further comprising:
forming a first electrode electrically connected to the first type doped semiconductor layer; and
forming a second electrode electrically connected to the second type doped semiconductor layer.

12. The method of fabricating the light emitting diode as claimed in claim 1, wherein substantially no barrier layer is formed between growth temperature T1 and growth temperature T2.

13. A method of fabricating a light emitting diode, comprising:
forming a first type doped semiconductor layer on a substrate;
forming a light emitting layer on the first type doped semiconductor layer, comprising:
forming a quantum well layer and a barrier layer in each of a plurality of successive temperature cycles between a substantially low growth temperature T1 at which the quantum well layer is formed to avoid precipitation in the quantum well layer and a substantially high growth temperature T2 at which the barrier layer is formed to improve epitaxy quality of the barrier layer, wherein the growth temperature T1 is lower than the growth temperature T2, and wherein in each temperature cycle, a single barrier layer is formed at the growth temperature T2; and
forming a second type doped semiconductor layer on the light emitting layer.

14. The method of fabricating the light emitting diode as claimed in claim 13, wherein all barrier layers in the temperature cycles are formed at the growth temperature T2.

15. The method of fabricating the light emitting diode as claimed in claim 14, wherein $T2-T1 \geq 30°$ C.

16. The method of fabricating the light emitting diode as claimed in claim 15, wherein substantially no barrier layer is formed between growth temperature T1 and growth temperature T2.

17. The method of fabricating the light emitting diode as claimed in claim 13, wherein the barrier layer comprises gallium nitride, and the quantum well layer comprises indium gallium nitride, wherein precipitation of indium in the quantum well layers is decreased at the substantially low growth temperature T1 in the temperature cycles.

18. The method of fabricating the light emitting diode as claimed in claim 13, wherein the growth temperature T2 is lower than a growth temperature of the first type doped semiconductor layer, and the growth temperature T2 is lower than a growth temperature of the second type doped semiconductor layer.

19. The method of fabricating the light emitting diode as claimed in claim 18, wherein the first type doped semiconductor layer comprises n-type doped gallium nitride, and the second type doped semiconductor layer comprises p-type doped gallium nitride.

20. The method of fabricating the light emitting diode as claimed in claim 13, wherein the growth temperature T1 is between 700° C. to 900° C., and the growth temperature T2 is between 800° C. to 1100° C.

21. The method of fabricating the light emitting diode as claimed in claim 13, wherein forming the barrier layer and the quantum well layer in each temperature cycle comprises:
forming the barrier layer at the growth temperature T2;
ramping down process temperature from the growth temperature T2 to the growth temperature T1;
forming the quantum well layer at the growth temperature T1; and
ramping up the process temperature from the growth temperature T1 to the growth temperature T2.

22. A method of fabricating a light emitting diode, comprising:
forming a first type doped semiconductor layer on a substrate;
forming a light emitting layer on the first type doped semiconductor layer, comprising: forming a quantum well layer and a barrier layer in each of a plurality of successive temperature cycles between a substantially low growth temperature T1 at which the quantum well layer is formed to avoid precipitation in the quantum well layer and a substantially high growth temperature T2 at which the barrier layer is formed to improve epitaxy quality of the barrier layer, wherein the growth temperature T1 is lower than the growth temperature T2, and wherein all barrier layers in the temperature cycles are formed at the growth temperature T2; and
forming a second type doped semiconductor layer on the light emitting layer.

23. The method of fabricating the light emitting diode as claimed in claim 22, wherein the barrier layer comprises gallium nitride, and the quantum well layer comprises indium gallium nitride, wherein precipitation of indium in the quantum well layers is decreased at the substantially low growth temperature T1 in the temperature cycles.

* * * * *